United States Patent
Miyamoto et al.

(10) Patent No.: US 12,378,376 B2
(45) Date of Patent: Aug. 5, 2025

(54) OPTICALLY SOFTENING RESIN COMPOSITION, METHOD FOR PRODUCING SOFTENED PRODUCT OF OPTICALLY SOFTENING RESIN COMPOSITION, CURABLE RESIN COMPOSITION AND CURED PRODUCT OF SAME, AND PATTERNED FILM AND METHOD FOR PRODUCING SAME

(71) Applicant: Showa Denko Materials Co., Ltd., Tokyo (JP)

(72) Inventors: Yuki Miyamoto, Tokyo (JP); Junichi Kamei, Tokyo (JP); Hiroshi Osaki, Tokyo (JP); Koichi Saito, Tokyo (JP); Takashi Kumaki, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 659 days.

(21) Appl. No.: 17/601,832

(22) PCT Filed: Apr. 7, 2020

(86) PCT No.: PCT/JP2020/015745
§ 371 (c)(1),
(2) Date: Oct. 6, 2021

(87) PCT Pub. No.: WO2020/209268
PCT Pub. Date: Oct. 15, 2020

(65) Prior Publication Data
US 2022/0162406 A1    May 26, 2022

(30) Foreign Application Priority Data
Apr. 11, 2019 (JP) .................. 2019-075721

(51) Int. Cl.
*C08J 5/18* (2006.01)
*C08G 18/24* (2006.01)
(Continued)

(52) U.S. Cl.
CPC .............. *C08J 5/18* (2013.01); *C08G 18/246* (2013.01); *C08G 18/3876* (2013.01);
(Continued)

(58) Field of Classification Search
CPC ...... G03F 7/0275; G03F 7/028; G03F 7/0045; C08L 81/04; C08G 75/14
See application file for complete search history.

(56) References Cited

U.S. PATENT DOCUMENTS 4,131,716 A * 12/1978 Bertozzi ............... C08F 299/06
427/508
4,308,367 A * 12/1981 Green ................... G03F 7/0275
428/441
(Continued)

FOREIGN PATENT DOCUMENTS

JP        55156940 A  * 12/1980
JP        55164825 A  * 12/1980
(Continued)

OTHER PUBLICATIONS

English translation of JP55164825. (Year: 1980).*
(Continued)

*Primary Examiner* — Mark F. Huff
*Assistant Examiner* — Anna Malloy
(74) *Attorney, Agent, or Firm* — FITCH, EVEN, TABIN & FLANNERY, LLP

(57) ABSTRACT

An optically softening resin composition contains a compound having a disulfide bond; and a radical scavenger. The compound having a disulfide bond may be a copolymer including a monomer unit having a disulfide bond and a
(Continued)

functional group, and a monomer unit having a substituent reactive with the functional group. A curable resin composition contains a monomer having a disulfide bond and a functional group; a monomer having a substituent reactive with the functional group; and a radical scavenger.

6 Claims, 1 Drawing Sheet

(51) Int. Cl.
*C08G 18/38* (2006.01)
*C08G 18/76* (2006.01)
*C08G 75/045* (2016.01)
*C08K 5/45* (2006.01)
*C08K 5/5397* (2006.01)
*G03F 7/038* (2006.01)
*G03F 7/039* (2006.01)

(52) U.S. Cl.
CPC ....... *C08G 18/7671* (2013.01); *C08G 75/045* (2013.01); *C08K 5/45* (2013.01); *C08K 5/5397* (2013.01); *G03F 7/038* (2013.01); *G03F 7/039* (2013.01); *C08J 2375/04* (2013.01); *C08K 2201/014* (2013.01)

(56) References Cited

U.S. PATENT DOCUMENTS

| | | | | |
|---|---|---|---|---|
| 4,310,615 | A * | 1/1982 | Steelman | B41M 3/12 |
| | | | | 430/905 |
| 5,391,664 | A * | 2/1995 | Takei | C08F 4/32 |
| | | | | 526/225 |
| 5,391,665 | A | 2/1995 | Matsunaga et al. | |
| 2002/0058778 | A1 * | 5/2002 | Konarski | H01L 23/293 |
| | | | | 257/E21.503 |
| 2005/0085587 | A1 * | 4/2005 | Park | C08L 61/06 |
| | | | | 524/594 |
| 2019/0256751 | A1 * | 8/2019 | Townsend | C08K 5/17 |

FOREIGN PATENT DOCUMENTS

| | | | |
|---|---|---|---|
| JP | S55-156940 A | | 12/1980 |
| JP | S55-164825 A | | 12/1980 |
| JP | 02111950 A | * | 4/1990 |
| JP | H2-111950 A | | 4/1990 |
| JP | 08211594 A | * | 8/1996 |
| JP | H8-211594 A | | 8/1996 |
| JP | 09031389 A | * | 2/1997 |
| JP | H9-031389 A | | 2/1997 |
| JP | 11038621 A | * | 2/1999 |
| JP | H11-038621 A | | 2/1999 |
| JP | H11-190883 A | | 7/1999 |
| JP | 2002308966 A | * | 10/2002 |
| JP | 2007187982 A | * | 7/2007 |
| JP | 2018-076433 A | | 5/2018 |

OTHER PUBLICATIONS

English translation of JP55156940. (Year: 1980).*
English translation of JP02111950. (Year: 1990).*
English translation of JP09031389. (Year: 1997).*
English translation of JP11038621. (Year: 1999).*
English translation of JP08211594. (Year: 1996).*
English translation of JP2007187982. (Year: 2007).*
English translation of JP2002308966. (Year: 2002).*

* cited by examiner

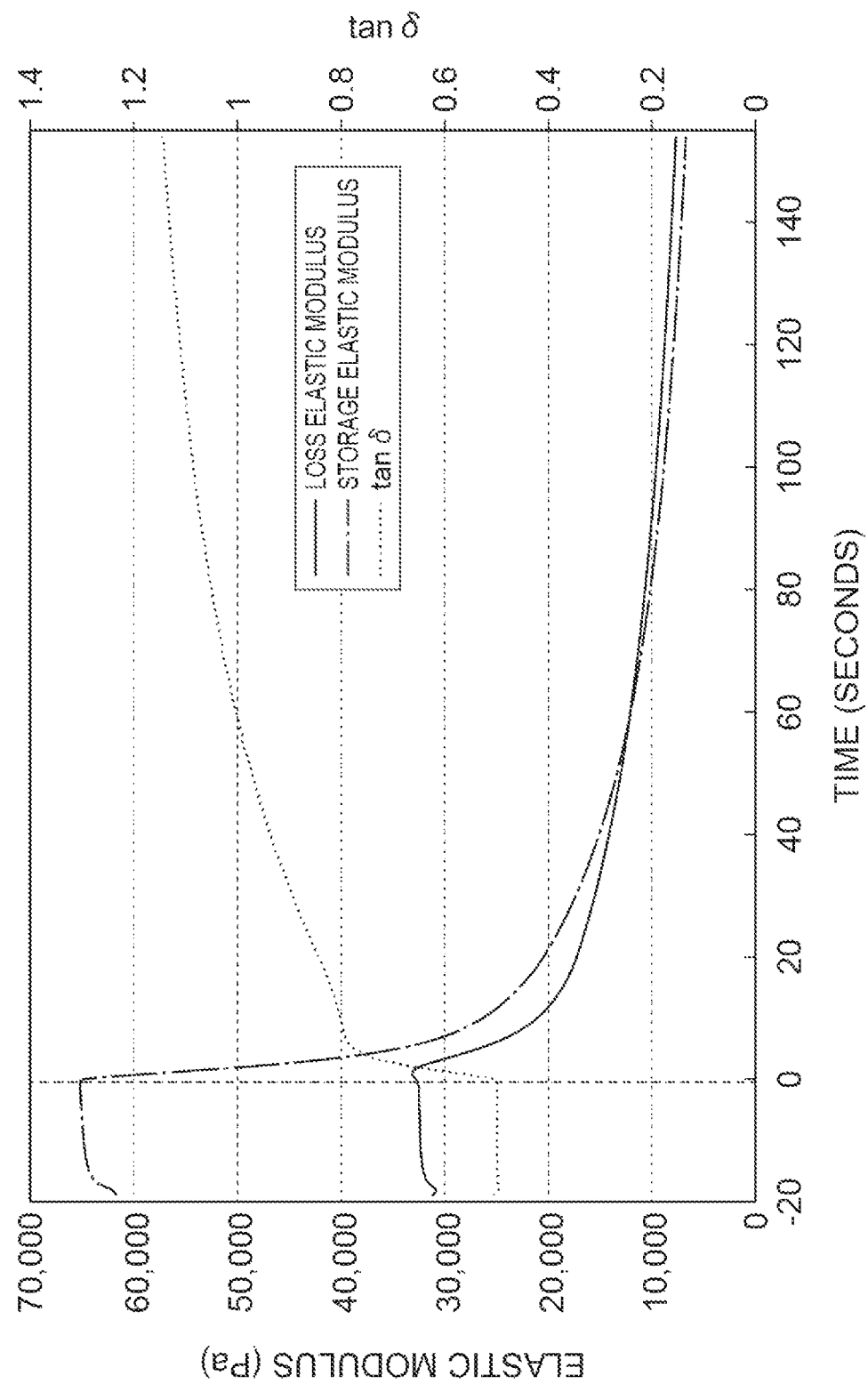

OPTICALLY SOFTENING RESIN COMPOSITION, METHOD FOR PRODUCING SOFTENED PRODUCT OF OPTICALLY SOFTENING RESIN COMPOSITION, CURABLE RESIN COMPOSITION AND CURED PRODUCT OF SAME, AND PATTERNED FILM AND METHOD FOR PRODUCING SAME

CROSS-REFERENCE TO RELATED APPLICATIONS

This application is a U.S. national phase application filed under 35 U.S.C. § 371 of International Application No. PCT/JP2020/015745, filed Apr. 7, 2020, designating the United States, which claims priority from Japanese Application No. 2019-075721, filed Apr. 11, 2019, which are hereby incorporated herein by reference in their entirety.

TECHNICAL FIELD

The present invention relates to an optically softening resin composition, a method for producing a softened product of an optically softening resin composition, a curable resin composition and a cured product of the same, and a patterned film and a method for producing the same.

BACKGROUND ART

An optically softening resin composition that is softened by light irradiation is used in various purposes. For example, in Patent Literature 1, an image forming apparatus including a recording member containing an optically softening resin having an optically softening resin composition is disclosed.

CITATION LIST

Patent Literature

Patent Literature 1: JP No. H11-190883

SUMMARY OF INVENTION

Technical Problem

A main object of the present invention is to provide a novel optically softening resin composition.

Solution to Problem

One aspect of the present invention provides an optically softening resin composition. The optically softening resin composition contains a compound having a disulfide bond, and a radical scavenger. In a case where such an optically softening resin composition is irradiated with light, in the compound having a disulfide bond, the disulfide bond is decomposed (cleaved), and thiyl radicals are generated. At this time, in a case where the radical scavenger exists in the optically softening resin composition, the thiyl radicals react with the radical scavenger. It is assumed that such a reaction allows the compound having a disulfide bond to have a low molecular weight and softens the optically softening resin composition. It can be said that such a reaction is an irreversible reaction. In a case where the radical scavenger is a hydrogen donator, it is assumed that a main component in a softened product of the optically softening resin composition is a compound having a thiol (SH) group that is generated by the thiyl radicals abstracting hydrogen from the hydrogen donator. On the other hand, in a case where the radical scavenger is a photoradical initiator, a reaction mechanism without a cleaving step of allowing the compound having a disulfide bond itself to have a low molecular weight is also assumed in which photoinduced radicals that are caused by a photoradical initiator directly react with the disulfide bond to form a photoinduced radical-thioether bond and generate thiyl radicals, and the thiyl radicals react with other photoinduced radicals.

The compound having a disulfide bond may be a copolymer including a monomer unit having a disulfide bond and a functional group, and a monomer unit having a substituent reactive with the functional group. Since such a copolymer is generally a solid (a solid content) at 25° C., the copolymer can be used in the form of a film, a block, or the like by removing a volatile component such as a solvent in (a varnish of) the optically softening resin composition.

The optically softening resin composition may further contain a sensitizer.

Another aspect of the present invention relates to a method for producing a softened product of an optically softening resin composition. The method for producing a softened product includes irradiating the optically softening resin composition described above with light to obtain a softened product of the optically softening resin composition.

Another aspect of the present invention relates to a curable resin composition. The curable resin composition contains a monomer having a disulfide bond and a functional group, a monomer having a substituent reactive with the functional group, and a radical scavenger. In such a curable resin composition, the cured product can be formed by a reaction between the monomers to have a high molecular weight, by a method other than the light irradiation (for example, heating or the like). The cured product to be obtained can be used in the form of a film, a block, or the like.

The curable resin composition may further contain a curing catalyst. In addition, the curable resin composition may further contain a sensitizer.

Another aspect of the present invention relates to a cured product of the curable resin composition described above. The curable resin composition is cured by a reaction between a monomer having a disulfide bond and a functional group and a monomer having a substituent reactive with the functional group to have a high molecular weight. The cured product contains a copolymer including a monomer unit having a disulfide bond and a functional group, and a monomer unit having a substituent reactive with the functional group, that is, a compound having a disulfide bond, and a radical scavenger. That is, the cured product is one mode of the optically softening resin composition described above. Accordingly, the cured product can be softened by light irradiation.

Another aspect of the present invention relates to a patterned film. The patterned film has a pattern and contains the optically softening resin composition described above or the cured product of the curable resin composition described above.

Another aspect of the present invention relates to a method for producing a patterned film. The method for producing a patterned film includes a patterning step of patterning the optically softening resin composition described above or the cured product of the curable resin composition described above by irradiating at least a part of the optically softening resin composition or the cured product of the curable resin composition with light, and a developing step of developing the patterned optically softening resin composition or the patterned cured product of the curable resin composition. The developing may include developing the patterned optically softening resin composition or the patterned cured product of the curable resin composition by water washing.

Advantageous Effects of Invention

According to the present invention, a novel optically softening resin composition is provided. In addition, according to the present invention, a method for producing a softened product of an optically softening resin composition, using the optically softening resin composition described above, is provided. Further, according to the present invention, a novel curable resin composition and a cured product of the same are provided. In addition, according to the present invention, a patterned film and a method for producing the same, using the curable resin composition and the cured product of the same, described above, are provided.

BRIEF DESCRIPTION OF DRAWINGS

FIG. 1 is a graph illustrating a change in an elastic modulus and a loss tangent (tan δ) at 25° C. with respect to a light irradiation time of an optically softening resin film of Example 1.

DESCRIPTION OF EMBODIMENTS

Hereinafter, an embodiment of the present invention will be described in detail. However, the present invention is not limited to the following embodiment.

Herein, an "optically softening resin composition" indicates a resin composition having properties of being softened by light irradiation (for example, properties of decreasing an elastic modulus, increasing a loss tangent (tan δ), decreasing hardness, or the like). Herein, a "softened product of an optically softening resin composition" indicates a product in the state of a decreased elastic modulus, an increased loss tangent (tan δ), decreased hardness, or the like, on the basis of the optically softening resin composition before light irradiation.

In addition, herein, the term of "step" includes not only an independent step but also a step that is not explicitly distinguishable from other steps, insofar as a desired action of the step is attained. In addition, a numerical range represented by using "to" indicates a range including numerical values before and after "to" as a minimum value and a maximum value, respectively.

In addition, herein, in a case where there are a plurality of substances corresponding to each component in a composition, the content of each component in the composition indicates the total amount of the plurality of substances in the composition, unless otherwise noted. In addition, only one type of exemplified materials may be used, or two or more types thereof may be used in combination, unless otherwise noted.

In addition, in numerical ranges described in stages herein, an upper limit value or a lower limit value of a numerical range in one stage may be replaced with an upper limit value or a lower limit value of a numerical range in another stage. In addition, in a numerical range described herein, an upper limit value or a lower limit value of the numerical range may be replaced with values described in Examples.

In addition, herein, "(meth)acryloyl group" indicates an acryloyl group or a methacryloyl group, and the same is applied to other similar expressions. "A or B" may include any one of A and B, or may include both of A and B.

[Optically Softening Resin Composition]

An optically softening resin composition of one embodiment contains a compound having a disulfide bond (hereinafter, may be referred to as an (A) component), and a radical scavenger (hereinafter, may be referred to as a (B) component).

(A) Component: Compound Having Disulfide Bond

The (A) component has a disulfide bond that is capable of generating thiyl radicals by light irradiation. The (A) component is not particularly limited insofar as the (A) component is a compound having a disulfide bond (—S—S—), and since the (A) component has a low molecular weight by the light irradiation, the (A) component may be a high-molecular weight component of a polymer or an oligomer. Only one type of the (A) components may be used, or two or more types thereof may be used in combination. It is preferable that the (A) component has a plurality of (two or more) disulfide bonds.

The (A) component, for example, may be a copolymer obtained by a reaction between a monomer having a disulfide bond and a functional group (hereinafter, may be referred to as an "(A-1) component") and a monomer having a substituent reactive with the functional group (hereinafter, may be referred to as an "(A-2) component"), in other words, a reactant of the (A-1) component and the (A-2) component, that is, a copolymer including a monomer unit of the (A-1) component and a monomer unit of the (A-2) component.

Examples of the functional group in the (A-1) component include a thiol group, a carboxy group, a hydroxyl group, an amino group, and the like. The functional group in the (A-1) component, for example, may be at least one type selected from the group consisting of a thiol group, a carboxy group, and a hydroxyl group. The number of functional groups of the (A-1) component may be 2 or more, from the viewpoint of having a high molecular weight. On the other hand, since when the optically softening resin composition is irradiated with light, the optically softening resin composition tends to be easily softened to the form of a liquid (a liquid) as the degree of cross-linkage of the (A) component decreases, it is preferable to use a monomer having two functional groups as the (A-1) component, and in the case of using a plurality of monomers having different numbers of functional groups, it is preferable to increase a use rate of the monomer having two functional groups. A ratio of the monomer having two functional groups may be 75 to 100 mass %, 85 to 100 mass %, or 90 to 100 mass %, on the basis of the total amount of the (A-1) component. A ratio of a monomer having three or more functional groups may be 0 to 10 mass %, 0 to 15 mass %, or 0 to 25 mass %, on the basis of the total amount of the (A-1) component.

Examples of a commercially available product of the (A-1) component include Thiokol LP series (a polysulfide polymer, manufactured by Toray Fine Chemicals Co., Ltd.), a 3,3'-dithiodipropionic acid (manufactured by Tokyo Chemical Industry Co., Ltd.), dithiodiethanol (manufactured by Tokyo Chemical Industry Co., Ltd.), and the like. Only one type of the (A-1) components may be used, or two or more types thereof may be used in combination.

The (A-2) component is the monomer having a substituent reactive with the functional group, and can be used without any particular limitation insofar as the (A-2) component has a substituent reactive with the functional group.

Examples of the substituent include a group containing cyclic ether (for example, a glycidyl group or the like), an isocyanate group, a (meth)acryloyl group, an aldehyde group, an amino group, a hydroxyl group, a carboxy group, and the like. The substituent in the (A-2) component, for example, may be at least one type selected from the group consisting of a group containing cyclic ether, an isocyanate group, and a (meth)acryloyl group. The number of substituents in the (A-2) component may be 2 or more, from the viewpoint of having a high molecular weight. On the other hand, since when the optically softening resin composition is irradiated with light, the optically softening resin composition tends to be easily softened to the form of a liquid (a liquid) as the degree of cross-linkage of the (A) component decreases, it is preferable to use monomer having two substituents as the (A-2) component, and in the case of using a plurality of monomers having different numbers of substituents, it is preferable to increase a use rate of the monomer having two substituents.

In one mode of the (A-2) component, a ratio of a monomer having three or more substituents may be 20 mass % or more, 30 mass % or more, 40 mass % or more, or 50 mass % or more, and may be 90 mass % or less, or 75 mass % or less, on the basis of the total amount of the (A-2) component. A ratio of the monomer having two substituents may be 10 mass % or more, or 25 mass % or more, and may be 80 mass % or less, 70 mass % or less, 60 mass % or less, or 50 mass % or less, on the basis of the total amount of the (A-2) component.

In another mode of the (A-2) component, the ratio of the monomer having two substituents may be 75 to 100 mass %, 85 to 100 mass %, or 90 to 100 mass %, on the basis of the total amount of the (A-2) component. The ratio of the monomer having three or more substituents may be 0 to 10 mass %, 0 to 15 mass %, or 0 to 25 mass %, on the basis of the total amount of the (A-2) component.

Examples of the (A-2) component include a monomer having two or more groups containing cyclic ether in one molecule; a monomer having two or more isocyanate groups in one molecule; a monomer having two or more (meth) acryloyl groups in one molecule; a monomer having two or more amino groups in one molecule, and a monomer having two or more isocyanate groups and (meth)acryloyl groups in one molecule; a monomer having two or more groups containing cyclic ether and alkoxysilyl groups in one molecule; a monomer that is a combination of a compound having two or more isocyanate groups in one molecule or a compound having two or more groups containing cyclic ether in one molecule and a compound having an amino group, an acid anhydride skeleton, or a thiol group, and an alkoxysilyl group in one molecule; a monomer that is a combination of a compound having two or more isocyanate groups in one molecule and a compound having a hydroxyl group and a (meth)acryloyl group in one molecule; a monomer that is a combination of a compound having two or more groups containing cyclic ether in one molecule and a compound having a carboxy group and a (meth)acryloyl group in one molecule, and the like. Only one type of the (A-2) components may be used, or two or more types thereof may be used in combination.

Examples of a preferred combination of the (A-1) component and the (A-2) component include a combination of a monomer having a disulfide bond and a thiol group or a hydroxyl group and at least one type selected from the group consisting of a monomer having two or more groups containing cyclic ether in one molecule, a monomer having two or more (meth)acryloyl groups in one molecule, and a monomer having two or more isocyanate groups in one molecule; a combination of a monomer having a disulfide bond and a carboxy group and at least one type selected from the group consisting of a monomer having two or more groups containing cyclic ether in one molecule, a monomer having two or more amino groups in one molecule, and a monomer having two or more isocyanate groups in one molecule, and the like.

In the case of obtaining a copolymer that is the (A) component by a reaction between the (A-1) component and the (A-2) component, a reaction ratio of such components can be suitably adjusted on the basis of a functional group equivalent of the (A-1) component and a substituent equivalent of the (A-2) component. The reaction between the (A-1) component and the (A-2) component may be performed while heating. A reaction temperature, for example, may be 0 to 200° C., and a reaction time, for example, may be 0.1 to 240 hours.

In the case of performing the reaction between the (A-1) component and the (A-2) component, as necessary, a curing catalyst (hereinafter, may be referred to as an "(A-3) component") may be used. The (A-3) component can be arbitrarily selected in accordance with the type of functional group of the (A-1) component and the type of substituent of the (A-2) component. In the case of performing a reaction between a monomer having a thiol group or a hydroxyl group as a functional group, as the (A-1) component, and a monomer having an isocyanate group or a (meth)acryloyl group as a substituent, as the (A-2) component, the (A-3) component, for example, may be a tin-based catalyst or an amine-based catalyst. In the case of performing a reaction between a monomer having a carboxy group as a functional group, as the (A-1) component, and a monomer having a group containing cyclic ether as a substituent, as the (A-2) component, the (A-3) component, for example, may be an amine-based catalyst or a phosphorus-based catalyst.

Examples of the tin-based catalyst include dibutyl tin dilaurate, dibutyl tin dichloride, dibutyl tin oxide, dibutyl tin dibromide, dibutyl tin dimaleate, dioctyl tin dilaurate, dibutyl tin diacetate, dibutyl tin sulfide, tributyl tin sulfide, tributyl tin oxide, tributyl tin acetate, triethyl tin ethoxide, tributyl tin ethoxide, dioctyl tin oxide, tributyl tin chloride, tributyl tin trichloroacetate, tin 2-ethyl hexanoate, and the like.

Examples of the amine-based catalyst include triethyl amine, triethylene diamine, diazabicycloundecene (DBU), diazabicyclononene (DBN), and the like.

Examples of the phosphorus-based catalyst include triphenyl phosphine and an addition reactant thereof, (4-hydroxyphenyl) diphenyl phosphine, bis(4-hydroxyphenyl) phenyl phosphine, tris(4-hydroxyphenyl) phosphine, and the like.

The content of the (A-3) component may be 0.005 to 10 mass %, 0.01 to 5 mass %, or 0.02 to 3 mass %, on the basis of the total content of the (A-1) component and the (A-2) component.

A molecular weight or a weight average molecular weight of the (A) component may be 200 to 10000000, 1000 to 2000000, or 2500 to 1000000. Note that, the weight average molecular weight is a value in terms of polystyrene using a standard curve of standard polystyrene by a gel permeation chromatography method (GPC).

The total content of the (A) component ((A-1) component and the (A-2) component) may be 0.1 mass % or more, 0.5 mass % or more, 1 mass % or more, 5 mass % or more, 10 mass % or more, 20 mass % or more, 30 mass % or more, 40 mass % or more, 50 mass % or more, 60 mass % or more, 70 mass % or more, or 80 mass % or more, and may be 99.5 mass % or less, 99 mass % or less, 98 mass % or less, 95 mass % or less, or 90 mass % or less, on the basis of the total amount of the optically softening resin composition.

(B) Component: Radical Scavenger

The (B) component is a component that reacts with the thiyl radicals that are generated by irradiating the (A) component with light. Examples of such a (B) component include a compound generating radicals that react with the thiyl radicals by light irradiation (for example, a photoradical polymerization initiator or the like), and the like. Only one type of the (B) components may be used, or two or more types thereof may be used in combination.

Examples of the photoradical polymerization initiator include an intramolecular cleavage-type photoradical polymerization initiator, a hydrogen abstraction-type photoradical polymerization initiator, and the like. Examples of the intramolecular cleavage-type photoradical polymerization initiator include a benzyl ketal-based photoradical polymerization initiator; an α-hydroxyacetophenone-based photoradical polymerization initiator; a benzoin-based photoradical polymerization initiator; an aminoacetophenone-based photoradical polymerization initiator; an oxime ketone-based photoradical polymerization initiator; an acyl phosphine oxide-based photoradical polymerization initiator; a titanocene-based photoradical polymerization initiator; a S-phenyl thiobenzoate polymerization initiator; high-molecular weight derivatives thereof, and the like. Examples of the hydrogen abstraction-type photoradical polymerization initiator include a benzophenone-based photoradical initiator, a thioxanthone-based photoradical polymerization initiator, an anthraquinone-based photoradical polymerization initiator, and the like. In a case where the (B) component contains the photoradical polymerization initiator, the cleavage of the sulfide bond of the (A) component is promoted, and the thiyl radicals tend to be easily generated.

Examples of the (B) component other than the photoradical polymerization initiator include a spin scavenger, an oxidant inhibitor, a polymerization inhibitor, a hydrogen donator, and the like.

Examples of the spin scavenger include N-t-butyl-α-phenyl nitrone (PBN), 5,5-dimethyl-1-pyrroline-N-oxide (DMPO), and the like.

Examples of the oxidant inhibitor include a hindered amine-based oxidant inhibitor, a phenolic oxidant inhibitor, and the like.

Examples of the polymerization inhibitor include quinones such as hydroquinone, hydroquinone monomethyl ether, benzoquinone, p-tert-butyl catechol, 2,6-di-tert-butyl-4-methyl phenol, and pyrogallol, and the like.

Examples of the hydrogen donator include bis[4-(dimethyl amino)phenyl] methane, bis[4-(diethyl amino)phenyl] methane, N-phenyl glycine, leuco crystal violet, mercaptobenzoxazole, mercaptobenzoimidazole, mercaptobenzotriazole, and the like.

The content of the (B) component may be 0.5 mass % or more, 1 mass % or more, 3 mass % or more, or 5 mass % or more, on the basis of the total amount of the optically softening resin composition. When the optically softening resin composition is irradiated with light, the optically softening resin composition tends to be easily softened to the form of a liquid (a liquid) as the content of the (B) component increases. The content of the (B) component may be 50 mass % or less, 40 mass % or less, 30 mass % or less, or 20 mass % or less, on the basis of the total amount of the optically softening resin composition.

The optically softening resin composition may further contain a sensitizer (hereinafter, may be referred to as a "(C) component").

(C) Component: Sensitizer

The sensitizer is not particularly limited, and known triplet sensitizers can be used. Examples of the sensitizer include a benzoic acid-based photosensitizer, an amine-based photosensitizer, and the like. Only one type of the (C) components may be used, or two or more types thereof may be used in combination.

The content of the (C) component may be 0.1 to 10 mass %, 0.5 to 8 mass %, or 1 to 5 mass %, on the basis of the total amount of the optically softening resin composition.

The optically softening resin composition, for example, may contain additives such as a cohesiveness improver such as a coupling agent, a polymerization inhibitor, a light stabilizer, an antifoaming agent, a filler, a chain transfer agent, a thixotropy-imparting agent, a flame retarder, a mold release agent, a surfactant, a lubricant, and an antistatic agent, as other components. As such additives, known additives can be used. The total content of the other components may be 0 to 95 mass %, 0.01 to 50 mass %, or 0.1 to 10 mass %, on the basis of the total amount of the optically softening resin composition.

The optically softening resin composition may be used as a varnish of the optically softening resin composition that is diluted with a solvent (hereinafter, may be referred to as a "(D) component"). Examples of the (D) component include aromatic hydrocarbon such as toluene, xylene, mesitylene, cumene, and p-cymene; aliphatic hydrocarbon such as hexane and heptane; cyclic alkane such as methyl cyclohexane; cyclic ether such as tetrahydrofuran and 1,4-dioxane; ketone such as acetone, methyl ethyl ketone, methyl isobutyl ketone, cyclohexanone, and 4-hydroxy-4-methyl-2-pentanone; ester such as methyl acetate, ethyl acetate, butyl acetate, methyl lactate, ethyl lactate, and γ-butyrolactone; carbonic ester such as ethylene carbonate and propylene carbonate; amide such as N,N-dimethyl formamide, N,N-dimethyl acetamide, and N-methyl-2-pyrrolidone (NMP), and the like. Only one type of the (D) components may be used, or two or more types thereof may be used in combination.

The concentration of a solid component in the varnish may be 10 to 80 mass %, on the basis of the total mass of the varnish.

The optically softening resin composition, for example, can be prepared by mixing or kneading the (A) component and the (B) component, and components to be added as necessary. The mixing and kneading can be performed by suitably combining a general stirrer, a general crusher, and a general disperser such as a three-roll mill, a ball mill, and a bead mill In a case where the (A) component is a copolymer including the monomer unit of the (A-1) component and the monomer unit of the (A-2) component, the optically softening resin composition, for example, can be prepared by a method including a step of mixing or kneading the (A-1) component, the (A-2) component, the (B) component, and the (A-3) component, and the components to be added as necessary and performing the reaction between the (A-1) component and the (A-2) component to synthesize the (A) component (the reactant of the (A-1) component and the (A-2) component). In such a method, a reaction temperature, for example, may be 0 to 200° C., and a reaction time, for example, may be 0.1 to 240 hours. At this time, the (A-3) component may be deactivated by the (B) component, in accordance with the type of (A-3) component. Accordingly, the optically softening resin composition, for example, can also be prepared by a method including a first step of mixing or kneading the (A-1) component, the (A-2) component, and the (A-3) component, and the components to be added as necessary to obtain a mixture containing the (A) component (the reactant of the (A-1) component and the (A-2) component), and a second step of adding the (B) component to the mixture and performing mixing or kneading to obtain the optically softening resin composition. In this case, it is preferable that the mixture contains a solvent. In both of the first step and the second step of such a method, a reaction temperature for example, may be 0 to 200° C., and a reaction time, for example, may be 0.1 to 240 hours.

The optically softening resin composition can be used as an optically softening resin film by being formed into the shape of a film. In addition, the optically softening resin composition can be used as an optically softening resin block by being formed into the shape of a block. A method for forming the optically softening resin composition into the shape of a film or a block is not particularly limited, and known methods can be applied.

A storage elastic modulus of the optically softening resin composition (a cured product of a curable resin composition described below) at 25° C. may be 0.01 MPa (10000 Pa) or more from the viewpoint of weak pressure-sensitive adhesiveness or non-pressure-sensitive adhesiveness, thickening properties, slit processability, punching processability, shielding properties, and the like, may be 0.05 MPa (50000 Pa) or more from the viewpoint of bather properties, moisture-proof properties, adhesiveness, and the like, or may be 1 MPa (1000000 Pa) or more from the viewpoint of workability and the like. The storage elastic modulus of the optically softening resin composition at 25° C. is not particularly limited, and for example, may be 1000 MPa or less. Herein, the storage elastic modulus at 25° C. indicates a value to be measured by a method described in Examples.

A loss tangent (tan δ) of the optically softening resin composition (the cured product of the curable resin composition described below) at 25° C. may be 1.2 or less, 1.1 or less, or 1.0 or less, from the viewpoint of the weak pressure-sensitive adhesiveness or the non-pressure-sensitive adhesiveness, the thickening properties, the slit processability, the punching processability, the workability, and the like. Herein, the loss tangent at 25° C. indicates a value to be measured by a method described in Examples.

The hardness (Type E) of the optically softening resin composition (the cured product of the curable resin composition described below) may be E10 or more from the viewpoint of the weak pressure-sensitive adhesiveness or the non-pressure-sensitive adhesiveness, the thickening properties, the slit processability, the punching processability, the shielding properties, and the like, may be E20 or more from the viewpoint of the barrier properties, the moisture-proof properties, the adhesiveness, and the like, or may be E40 or more from the viewpoint of the workability and the like. Herein, the hardness indicates a value to be measured by a method described in Examples.

A ratio (Storage Elastic Modulus of Optically Softening Resin Composition after Light Irradiation at 25° C./Storage Elastic Modulus of Optically Softening Resin Composition before Light Irradiation at 25° C.) of the storage elastic modulus of the optically softening resin composition after the light irradiation (that is, a softened product of the optically softening resin composition) at 25° C. to the storage elastic modulus of the optically softening resin composition before the light irradiation at 25° C. may be 0.7 or less from the viewpoint of crease performance, moldability, stress resistance, the moisture-proof properties, repairability, and the like, may be 0.5 or less from the viewpoint of wettability, embedding property, the pressure-sensitive adhesiveness, the repairability, and the like, or may be 0.3 or less from the viewpoint of melting properties, solubility, fluidity, and the like.

A ratio (Loss Tangent of Optically Softening Resin Composition after Light Irradiation at 25° C./Loss Tangent of Optically Softening Resin Composition before Light Irradiation at 25° C.) of the loss tangent (tan δ) of the optically softening resin composition after the light irradiation (that is, the softened product of the optically softening resin composition) at 25° C. to the loss tangent (tan δ) of the optically softening resin composition before the light irradiation at 25° C. may be 1.1 or more, 1.2 or more, or 1.3 or more, from the viewpoint of the weak pressure-sensitive adhesiveness or the non-pressure-sensitive adhesiveness, the thickening properties, the slit processability, the punching processability, the workability, and the like.

The viscosity of the optically softening resin composition after the light irradiation (the cured product of the curable resin composition described below) at 25° C. may be 1000000 mPa·s (1000 Pa·s) or less from the viewpoint of the wettability, the embedding property, the pressure-sensitive adhesiveness, the repairability, and the like, or may be 100000 mPa·s (100 Pa·s) or less from the viewpoint of the melting properties, the solubility, the fluidity, and the like. Herein, the viscosity at 25° C. indicates a value to be measured by a method described in Examples.

The optically softening resin composition of this embodiment has properties that the disulfide bond (—S—S—) in the (A) component is cleaved by the light irradiation, and the compound having a disulfide bond has a low molecular weight and is softened. The optically softening resin composition of this embodiment can be softened to a liquid (the form of a liquid). In addition, the optically softening resin composition of this embodiment has properties that the optically softening resin composition is easily molded into the shape of a film or a block. By using such properties, the optically softening resin composition of this embodiment, for example, can be applied to the purpose of a photoresist agent in photolithography, and can be used as a photosensitive resin composition or a photosensitive resin film. The photosensitive resin composition or the photosensitive resin film can be patterned by light irradiation (exposure), and can be developed by water washing after the light irradiation (the exposure). The optically softening resin composition of this embodiment can be preferably used in the form of a patterned film.

In addition, the optically softening resin composition of this embodiment, for example, can be applied to various purposes such as a softener or an easy peeling agent of a strong pressure-sensitive adhesive tape; an agent for pressure-sensitive adhesion of a weak pressure-sensitive adhesive film or a non-pressure-sensitive adhesive film; a partial softener of a coating material, a pressure-sensitive adhesive agent, or an adhesive agent; a partial softener of a molding material; a punching-processable ultralow-elastic film that is obtained by light irradiation after punching; a moisture-proof agent; a capsular film that is softened and dissolved by light irradiation; and a thickener that reduces a viscosity by light irradiation.

[Method for Producing Softened Product of Optically Softening Resin Composition]

A method for producing the softened product of the optically softening resin composition of one embodiment includes a step of irradiating the optically softening resin composition described above with light to obtain the softened product of the optically softening resin composition.

The light in the light irradiation is not particularly limited, and for example, may be ultraviolet light or visible light. The wavelength of the light in the light irradiation may be 150 to 830 nm. The light irradiation, for example, can be performed in a condition of irradiance of 100 mJ/cm$^2$ or more by using a light irradiator. Note that, the irradiance indicates the product of an illuminance and an irradiation time (seconds). In addition, examples of a light source for ultraviolet light or visible light irradiation include a low-pressure mercury lamp, a medium-pressure mercury lamp, a high-pressure mercury lamp, a metal halide lamp, a LED lamp, and the like. The light irradiation may be directly performed with respect to the optically softening resin composition, or may be performed via glass or the like.

The light irradiation of the optically softening resin composition may be performed while heating. A heating condition, for example, may be 40 to 200° C.

[Curable Resin Composition and Cured Product of Same]

The curable resin composition of one embodiment contains the (A-1) component, the (A-2) component, and the (B) component. In the curable resin composition of this embodiment, the cured product can be formed by the reaction between the (A-1) component and the (A-2) component to have a high molecular weight, by a method other than the light irradiation (for example, heating or the like). In a case where the reaction between the (A-1) component and the (A-2) component is performed by heating, a heating temperature, for example, may be 40 to 200° C., and a heating time, for example, may be 0.1 to 48 hours. The cured product to be obtained can be used in the form of a film or the like, which can be used in the purpose of an adhesive agent, a coating material, or the like. In addition, the cured product to be obtained contains the copolymer including the monomer unit of the (A-1) component and the monomer unit of the (A-2) component (that is, the (A) component), and the (B) component. That is, the cured product is one mode of the optically softening resin composition described above. Accordingly, the cured product can be softened by the light irradiation.

The curable resin composition may further contain a curing catalyst. In addition, the curable resin composition may further contain a sensitizer, other components, a solvent, and the like. The type and the content of each of the components contained in the curable resin composition are identical to the type and the content of each of the components contained in the optically softening resin composition. Therefore, the repeated description will be omitted. Note that, the content of the (A) component corresponds to the total content of the (A-1) component and the (A-2) component.

The cured product of the curable resin composition of one embodiment is one mode of the optically softening resin composition described above. Accordingly, the cured product of the curable resin composition has properties that the cured product is softened by the light irradiation. The cured product of the curable resin composition of this embodiment can be softened to a liquid (the form of a liquid). In addition, the cured product of the curable resin composition of this embodiment has properties that the cured product is easily molded into the shape of a film or a block. By using such properties, the cured product can be applied to the purpose of a photoresist agent in photolithography, and can be used as a photosensitive resin composition or a photosensitive resin film. The photosensitive resin composition or the photosensitive resin film can be patterned by light irradiation (exposure), and can be developed by water washing after the light irradiation (the exposure). In addition, the cured product of the curable resin composition of this embodiment can be used in various purposes exemplified in the optically softening resin composition described above.

[Patterned Film and Method for Producing Same]

A patterned film of one embodiment has a pattern and contains the optically softening resin composition described above or the cured product of the curable resin composition described above. Since the optically softening resin composition described above or the cured product of the curable resin composition described above can be patterned by light irradiation (exposure), and can be developed by water washing after the light irradiation (the exposure), the patterned film can be formed by using the optically softening resin composition or the cured product of the curable resin composition.

A method for producing the patterned film of one embodiment includes a patterning step of patterning the optically softening resin composition described above or the cured product of the curable resin composition described above by irradiating (exposing) at least a part of the optically softening resin composition or the cured product of the curable resin composition with light, and a developing step of developing the patterned optically softening resin composition or the patterned cured product of the curable resin composition. The developing step may include a step of developing the patterned optically softening resin composition or the patterned cured product of the curable resin composition by water washing.

EXAMPLES

Hereinafter, the present invention will be described in detail by using Examples. However, the present invention is not limited to Examples described below.

Example 1

[Preparation of Curable Resin Composition]

100 parts by mass of Thiokol LP-55 (Number of Thiol Groups: 2, manufactured by Toray Fine Chemicals Co., Ltd.), as an (A-1) component, 6.3 parts by mass of diphenyl methane diisocyanate (Number of Isocyanate Groups: 2, manufactured by Nippon Polyurethane Industry Co., Ltd., Product Name: MILLIONATE MT), as an (A-2) component, and 10 parts by mass of diphenyl (2,4,6-trimethyl benzoyl) phosphine oxide (manufactured by IGM Resins B.V., Product Name: Omnirad TPO) and 5 parts by mass of 2-isopropyl thioxanthone (manufactured by Tokyo Chemical Industry Co., Ltd.), as a (B) component, were homogeneously mixed and dehydrated for 1 hour under a reduced pressure while stirring. After that, the pressure was returned to the normal pressure by nitrogen, and 0.02 parts by mass of dibutyl tin dilaurate (manufactured by Tokyo Fine Chemical CO., LTD., Product Name: LL-101), as an (A-3) component, was added to the mixture and homogeneously mixed to obtain a curable resin composition.

[Preparation of Evaluation Sample (Optically Softening Resin Composition)]

Two release polyethylene terephthalates (PET) (manufactured by FUJIMORI KOGYO CO., LTD., Product Name: BD-50) having a thickness of 50 μm were prepared. The curable resin composition prepared as described above was interposed between the two release PETs such that the thickness of the curable resin composition was 300 μm to prepare a laminate. The obtained laminate was heated at 85°

C. for 12 hours such that the curable resin composition was cured to obtain an evaluation sample that is an optically softening resin film (a cured product film of the curable resin composition).

[Evaluation of Evaluation Sample]

Ultraviolet light irradiation was performed with respect to the evaluation sample from a light transmissive bottom surface to measure a change in an elastic modulus and a change in a loss tangent (tan δ) at 25° C. with respect to a light irradiation time by using a viscoelasticity measuring device (manufactured by Anton Paar GmbH, Product Name: MCR-301). The light irradiation was continuously performed for 150 seconds in a condition of a wavelength of 405 nm and an illuminance of 1000 mW/cm$^2$ by using a LED lamp (manufactured by Panasonic Industrial Devices SUNX Co., Ltd., Product Name: Aicure UJ30/ANUJ6187). FIG. 1 is a graph illustrating a change in a dynamic elastic modulus and a loss tangent (tan δ) at 25° C. with respect to a light irradiation time of the optically softening resin film of Example 1. The optically softening resin film of Example 1 was approximately in the form of a liquid at an irradiance of 50000 mJ/cm$^2$ (in 50 seconds after the start of the light irradiation), and was a high-viscosity liquid after the end of the light irradiation. In Table 1, the results of a storage elastic modulus and a loss tangent of an optically softening resin composition at 25° C. before the light irradiation, in 50 seconds after the start of the light irradiation, and after the end of the light irradiation (in 150 seconds after the start of the light irradiation) are shown.

by being left to stand at 25° C. for 1 week (by a reaction between the (A-1) component and the (A-2) component), and an optically softening resin composition (a cured product of the curable resin composition) was taken out from the silicon container to obtain an optically softening resin block (a cured product block of the curable resin composition) having a length of 5 cm, a width of 5 cm, and a height of 1 cm. In addition, separately from the optically softening resin block, the curable resin composition was applied into the shape of a silicon sheet by using an applicator to have a length of 10 cm, a width of 10 cm, and a film thickness of 0.01 cm, and the curable resin composition was cured by being left to stand at 25° C. for 1 week to obtain an optically softening resin film (a cured product film of the curable resin composition).

[Evaluation of Evaluation Sample]

(Hardness Before Light Irradiation)

The hardness of the obtained optically softening resin block was measured by a method (Type C) defined in JIS K7312 and a method (Type E) defined in JIS K6253-3. As a durometer, an ASKER rubber durometer C type (manufactured by KOBUNSHI KEIKI CO., LTD.) or a durometer Type E (manufactured by TECLOCK Co., Ltd.) was used. Results are shown in Table 2.

(Viscosity after Light Irradiation)

Light irradiation was performed with respect to the optically softening resin film on the silicon sheet in a condition of 1000 mW/cm$^2$ and 20000 mJ/cm$^2$ by using a conveyer type LED exposure machine of 365 nm. The optically

TABLE 1

| Items | Before light irradiation | In 50 seconds after light irradiation | After end of light irradiation (in 150 seconds after light irradiation) |
|---|---|---|---|
| Storage elastic modulus at 25° C. (Pa) | 64900 | 13360 | 6843 |
| Ratio of storage elastic modulus after light irradiation to storage elastic modulus before light irradiation | — | 0.206 | 0.105 |
| Loss tangent at 25° C. | 0.505 | 0.973 | 1.14 |
| Ratio of loss tangent after light irradiation to loss tangent before light irradiation | — | 1.92 | 2.26 |

Example 2

Example 2-1

[Preparation of Curable Resin Composition]

As an (A-1) component, an (A-2) component, and a (B) component, components with amounts (Unit: parts by mass) shown in Table 2 were added to an ointment jar of 125 ml and mixed at 2000 rpm for 3 minutes by using a stirrer (manufactured by THINKY CORPORATION, Product Name: AWATORI RENTARO ARE-310). Next, the entire ointment jar was heated at 100° C. for 1 hour, and then, mixing was performed again at 2000 rpm for 3 minutes by using the stirrer, and it was checked that the (B) component was completely dissolved. An (A-3) component with an amount (Unit: parts by mass) shown in Table 2 was added to the ointment jar at 25° C. and mixed at 2000 rpm for 3 minutes by using the stirrer to obtain a curable resin composition.

[Preparation of Evaluation Sample (Optically Softening Resin Composition)]

The obtained curable resin composition was poured into a silicon container having a length of 5 cm, a width of 5 cm, and a depth of 1 cm, the curable resin composition was cured softening resin film became a liquid by the light irradiation. The generated liquid was scraped out with a spatula, and viscosity at 25° C. was measured by using a viscoelasticity measuring device (manufactured by Anton Paar GmbH, Product Name: MCR-301). Results are shown in Table 2.

Example 2-2

A curable resin composition was obtained as with Example 2-1, except that components with amounts (Unit: parts by mass) shown in Table 2 were used. In addition, an evaluation sample was prepared as with Example 2-1, and the same evaluation as that in Example 2-1 was performed. Results are shown in Table 2.

Example 2-3

A curable resin composition was obtained as with Example 2-1, except that components with amounts (Unit: parts by mass) shown in Table 2 were used, and an operation of heating the entire ointment jar at 100° C. for 1 hour was not performed. In addition, an evaluation sample was prepared as with Example 2-1, and the same evaluation as that in Example 2-1 was performed. Results are shown in Table 2.

Example 2-4

A curable resin composition was obtained as with Example 2-1, except that components with amounts (Unit: parts by mass) shown in Table 2 were used. In addition, an evaluation sample was prepared as with Example 2-1, and the same evaluation as that in Example 2-1 was performed. Results are shown in Table 2.

Example 2-5

[Preparation of Optically Softening Resin Composition]

As an (A-1) component, an (A-2) component, an (A-3) component, and a solvent, components with amounts (Unit: parts by mass) shown in Table 2 were added to a flask of 500 mL and stirred at 80° C. for 24 hours to perform a reaction between the (A-1) component and the (A-2) component. After that, as a (B) component, a component with an amount (Unit: parts by mass) shown in Table 2 was added to the flask at 25° C. and stirred at 25° C. for 30 minutes to obtain a varnish of an optically softening resin composition.

[Preparation of Evaluation Sample]

The obtained varnish of the optically softening resin composition was applied onto a silicon sheet by using an applicator to have a film thickness of 100 µm and dried at 80° C. for 5 hours to obtain an optically softening resin film having a film thickness of 100 µm. Next, the optically softening resin film having a film thickness of 100 µm was cut into 100 films having a length of 5 cm and a width of 5 cm, and the 100 films were stacked to obtain an optically softening resin block having a length of 5 cm, a width of 5 cm, and a height of 1 cm.

[Evaluation of Evaluation Sample]

The same evaluation as that in Example 2-1 was performed by using the obtained optically softening resin film and the obtained optically softening resin block. Results are shown in Table 2.

The details of each of the components shown in Table 2 are as follows.

(A-1) Component: Monomer Having Disulfide Bond and Functional Group
  A-1: Thiokol LP-55 (Number of Thiol Groups: 2, manufactured by Toray Fine Chemicals Co., Ltd.)
(A-2) Component: Monomer Having Substituent Reactive with Functional Group
  A-2-1: 1,4-butanediol diacrylate (Number of Acryloyl Groups: 2, manufactured by SHOWA DENKO MATERIALS CO., LTD., Product Name: FA-124AS)
  A-2-2: diphenyl methane diisocyanate (Number of Isocyanate Groups: 2, manufactured by Tosoh Corporation, Product Name: MILLIONATE MT)
(A-3) Component: Curing Catalyst
  A-3-1: diazabicycloundecene (manufactured by San-Apro Ltd., Product Name: DBU)
  A-3-2: diazabicyclononene (manufactured by San-Apro Ltd., Product Name: DBN)
(B) Component: Curing Catalyst
  B-1: diphenyl (2,4,6-trimethyl benzoyl) phosphine oxide (manufactured by IGM Resins B.V., Product Name: Omnirad TPO)
  B-2: 2-hydroxy-2-methyl-1-phenyl propanone (manufactured by IGM Resins B.V., Product Name: Omnirad 1173)
(D) Component: Solvent
  D-1: toluene (manufactured by Tokyo Chemical Industry Co., Ltd.)

TABLE 2

| Items | | Example 2-1 | Example 2-2 | Example 2-3 | Example 2-4 | Example 2-5 |
|---|---|---|---|---|---|---|
| (A-1) component | A-1 | 85.37 | 85.37 | 85.37 | 84.20 | 85.39 |
| (A-2) component | A-2-1 | 4.60 | 4.60 | 4.60 | — | 4.60 |
| | A-2-2 | — | — | — | 5.77 | — |
| (A-3) component | A-3-1 | 0.03 | — | 0.03 | 0.03 | 0.01 |
| | A-3-2 | — | 0.03 | — | — | — |
| (B) component | B-1 | 10.00 | 10.00 | — | 10.00 | 10.00 |
| | B-2 | — | — | 10.00 | — | — |
| (D) component | D-1 | — | — | — | — | 400.00 |
| Condition of reaction between (A-1) component and (A-2) component | | 25° C., 1 week | 25° C., 1 week | 25° C., 1 week | 25° C., 1 week | 80° C., 24 hours |
| Hardness before light irradiation | Type C | 35 | 47 | 40 | 62 | 37 |
| | Type E | 24 | 32 | 28 | 40 | 25 |
| Viscosity after light irradiation (25° C., Pa · s) | | 50 | 50 | 109 | 210 | 50 |

Example 3

[Preparation of Photosensitive Resin Film (Optically Softening Resin Film or Cured Product Film of Curable Resin Composition)]

9.75 parts by mass of Thiokol LP-3 (Number of Thiol Groups: 2, manufactured by Toray Fine Chemicals Co., Ltd.), as an (A-1) component, and 0.25 parts by mass of diazabicycloundecene (manufactured by San-Apro Ltd., Product Name: DBU), as an (A-3) component, were added to an ointment jar and mixed at 2000 rpm for 3 minutes by using a stirrer (manufactured by THINKY CORPORATION, Product Name: AWATORI RENTARO ARE-310) to obtain a first mixed liquid. Next, 5.30 parts by mass of Thiokol LP-3, as an (A-1) component, 1.86 parts by mass of polyethylene glycol diacrylate (Number of Acryloyl Groups: 2, manufactured by SHOWA DENKO MATERIALS CO., LTD., Product Name: FA-240S) and 1.69 parts by mass of NK ester ATM-35E (Number of Acryloyl Groups: 4, manufactured by SHIN-NAKAMURA CHEMICAL CO., LTD., Product Name), as an (A-2) component, and 2.5 parts by mass of diphenyl (2,4,6-trimethyl benzoyl) phosphine oxide (manufactured by IGM Resins B.V., Product Name: Omnirad TPO), as a (B) component, were added to another ointment jar and were mixed at 2000 rpm for 3 minutes by using the same stirrer as described above, the ointment jar was heated at 100° C. for 1 hour, and then, mixing was performed at the number of rotations 2000 rpm for 3 minutes to obtain a second mixed liquid. Next, 0.15 parts by mass of the first mixed liquid was added to the ointment jar containing the second mixed liquid at 25° C. and mixed at the number of rotations of 2000 rpm for 1.5 minutes, and then, immediately applied onto a copper plate by using an applicator to have a film thickness of 50 µm, and cured in a condition of 60° C. for 24 hours to have a photosensitive resin film having a film thickness of 50 µm.

[Examination of Preparation of Patterned Film]

The obtained photosensitive resin film was irradiated with an i-line (a spectral line of mercury having a wavelength of 365 nm) of an incident-light high-pressure mercury lamp having an illuminance of 5 mW/cm$^2$ for 30 minutes via a photomask having a circular opening portion of 1 mm Φ. After that, the photosensitive resin film after the i-line irradiation was developed at 25° C. for 3 minutes by a water washing machine, and then, dried. The dried photosensitive resin film was checked, and it was found that an opening portion was formed into the shape of a circle of 1 mm Φ on the copper plate. From this, it was suggested that a patterned film can be formed by using the photosensitive resin film.

The invention claimed is:

1. A patterned film having a pattern, the film comprising a cured product of a heat-curable resin composition, comprising:
   a monomer having a disulfide bond and a functional group;
   a monomer having a substituent reactive with the functional group;
   a curing catalyst; and
   a compound generating radicals by light irradiation.

2. The patterned film according to claim 1, wherein the heat-curable resin composition is not cured by light irradiation.

3. The patterned film according to claim 1, wherein the heat-curable resin composition further comprises a sensitizer.

4. A method for producing a patterned film, the method comprising:
   patterning a cured product of a heat-curable resin composition by irradiating at least a part of the cured product of the heat-curable resin composition with light, the heat-curable resin composition comprising:
     a monomer having a disulfide bond and a functional group;
     a monomer having a substituent reactive with the functional group;
     a curing catalyst; and
     a compound generating radicals by light irradiation; and
   developing the patterned cured product of the heat-curable resin composition.

5. The method according to claim 4, wherein the cured product of the heat-curable resin composition has not been cured by light irradiation.

6. The method according to claim 4, wherein the heat-curable resin composition further comprises a sensitizer.

* * * * *